(12) United States Patent
Lin

(10) Patent No.: US 12,249,559 B2
(45) Date of Patent: Mar. 11, 2025

(54) CONDUCTIVE FEATURES WITH AIR SPACER AND METHOD OF FORMING SAME

(71) Applicant: Taiwan Semiconductor Manufacturing Co., Ltd., Hsinchu (TW)

(72) Inventor: Hsiang-Wei Lin, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 234 days.

(21) Appl. No.: 17/568,984

(22) Filed: Jan. 5, 2022

(65) Prior Publication Data

US 2023/0038952 A1 Feb. 9, 2023

Related U.S. Application Data

(60) Provisional application No. 63/229,662, filed on Aug. 5, 2021.

(51) Int. Cl.
*H01L 23/482* (2006.01)
*H01L 21/762* (2006.01)

(52) U.S. Cl.
CPC .... *H01L 23/4821* (2013.01); *H01L 21/76289* (2013.01); *H01L 23/4828* (2013.01)

(58) Field of Classification Search
CPC ........... H01L 23/4821; H01L 21/76829; H01L 23/5222; H01L 21/76834; H01L 21/76289; H01L 21/7682; H01L 2221/1063; H01L 23/4828
See application file for complete search history.

(56) References Cited

U.S. PATENT DOCUMENTS

| | | | |
|---|---|---|---|
| 2015/0332999 A1* | 11/2015 | Ting | H01L 21/76816 438/618 |
| 2018/0012791 A1* | 1/2018 | Sun | H01L 23/5222 |
| 2022/0406647 A1* | 12/2022 | Chou | H01L 21/76805 |

FOREIGN PATENT DOCUMENTS

TW 201731021 A 9/2017

* cited by examiner

*Primary Examiner* — Latanya N Crawford Eason
(74) *Attorney, Agent, or Firm* — Slater Matsil, LLP

(57) ABSTRACT

A device includes a first conductive feature in an insulating layer; a dielectric layer over the first conductive feature; a second conductive feature in the dielectric layer, wherein the second conductive feature is over and physically contacting the first conductive feature; an air spacer encircling the second conductive feature, wherein sidewalls of the second conductive feature are exposed to the air spacer; a metal cap covering the second conductive feature and extending over the air spacer, wherein the air spacer is sealed by a bottom surface of the metal cap; a first etch stop layer on the dielectric layer, wherein a sidewall of the first etch stop layer physically contacts a sidewall of the metal cap; and a second etch stop layer extending on a top surface of the metal cap and a top surface of the first etch stop layer.

20 Claims, 18 Drawing Sheets

CONDUCTIVE FEATURES WITH AIR SPACER AND METHOD OF FORMING SAME

PRIORITY CLAIM AND CROSS-REFERENCE

This application claims the benefits of U.S. Provisional Patent Application No. 63/229,662, filed on Aug. 5, 2021, which application is hereby incorporated herein by reference in its entirety.

BACKGROUND

Integrated circuit devices such as transistors are formed on semiconductor wafers. The devices are interconnected through metal lines and vias to form functional circuits, wherein the metal lines and vias are formed in back-end-of-line processes. To reduce the parasitic capacitance of the metal lines and vias, the metal lines and vias are formed in low-k dielectric layers, which typically have k values lower than 3.8, lower than 3.0, or lower than 2.5.

In the formation of the metal lines and vias in a low-k dielectric layer, the low-k dielectric layer is etched to form trenches and via openings. The etching of the low-k dielectric layer may involve forming a patterned hard mask over the low-k dielectric material, and using the patterned hard mask as an etching mask to form trenches. Via openings are also formed underlying the trenches. The trenches and the via openings are then filled with a metallic material, which may comprise copper. A Chemical Mechanical Polish (CMP) process is then performed to remove excess portions of the metallic material over the low-k dielectric layer.

Air spacers are known to have a low k value, which is equal to 1.0. In conventional processes for forming air spacers between metal lines, the dielectric material between two metal lines is removed first, followed by re-depositing another dielectric material between the two metal lines. The deposition process is controlled so that an air spacer is formed in the refilled dielectric material. A CMP process is then performed to remove excess portions of the filled dielectric material, which excess portions are over the metal lines.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
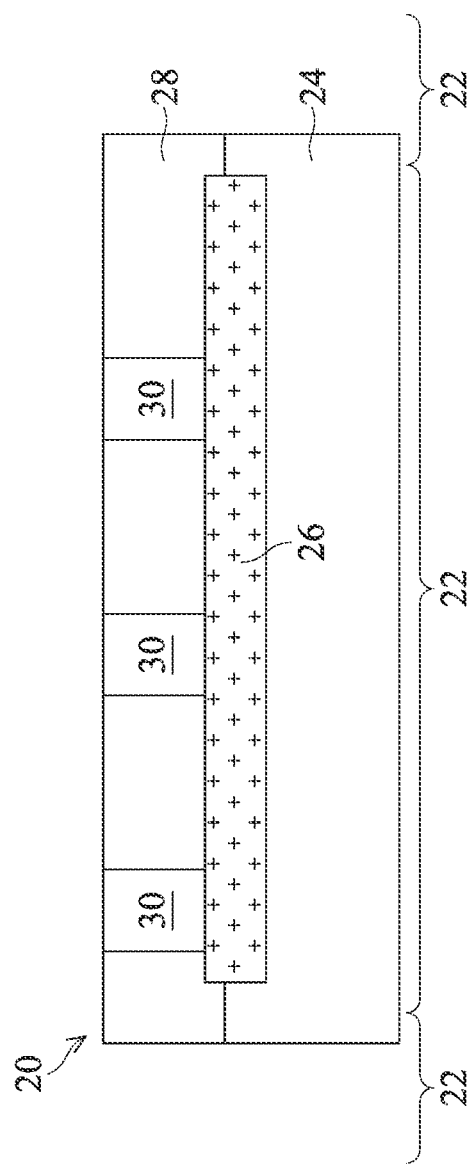
FIGS. 1-15 illustrate cross-sectional views of intermediate stages in the formation of conductive features with air spacers, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An air spacer and the method of forming the same are provided. In accordance with some embodiments of the present disclosure, a sacrificial spacer is formed on a conductive feature. The sacrificial spacer is removed to form an air spacer around the conductive feature. An inhibitor material is formed on the conductive feature, and the inhibitor material may extend over the top of the air spacer. A first etch stop layer is deposited selectively deposited in areas not covered by the inhibitor material. The inhibitor material is removed and a metal cap is selectively deposited on the conductive feature. The metal cap extends over the top of the air spacer and may seal the air spacer. Forming air spacers around conductive features in this manner can reduce parasitic capacitance and improve device performance.

Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1 through 15 illustrate the cross-sectional views of intermediate stages in the formation of conductive features and air spacers in accordance with some embodiments of the present disclosure. Turning to FIG. 1, a cross-sectional view of a package component 20 is illustrated. In accordance with some embodiments of the present disclosure, the package component 20 is a device wafer or the like. The package component 20 may comprise active devices and/or passive devices, which are represented schematically in FIG. 1 as the integrated circuit devices 26. A plurality of dies 22 may be formed in the package component 20 and subsequently singulated to form individual dies 22, in some embodiments. FIG. 1 illustrates an example die 22. In accordance with alternative embodiments of the present disclosure, the package component 20 is an interposer wafer, which may or may not include active devices and/or passive devices. The embodiments of the present disclosure are described in the context of the package component 20 comprising a device wafer, though the embodiments of the present disclosure may also be applied to other types of package components such as interposer wafers, package substrates, packages, or the like. In accordance with alternative embodiments, the package component 20 is used for forming interposers, and substrate 24 may be a semiconductor substrate or a dielectric substrate.

In accordance with some embodiments, the package component 20 is a device wafer comprising a substrate 24 formed of a semiconductor material. The substrate 24 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate 24 may include another elementary semiconductor, such as germanium; a compound semiconductor including silicon carbide, gallium arsenic, gallium phosphide, indium phosphide, indium arsenide, and/or indium antimonide; an alloy semiconductor including silicon germanium (SiGe), GaAsP, AlInAs, AlGaAs, GaInAs, GaInP, and/or GaInAsP; or combinations thereof. Other substrates, such as multi-layered or gradient substrates, may also be used.

Figure 18:
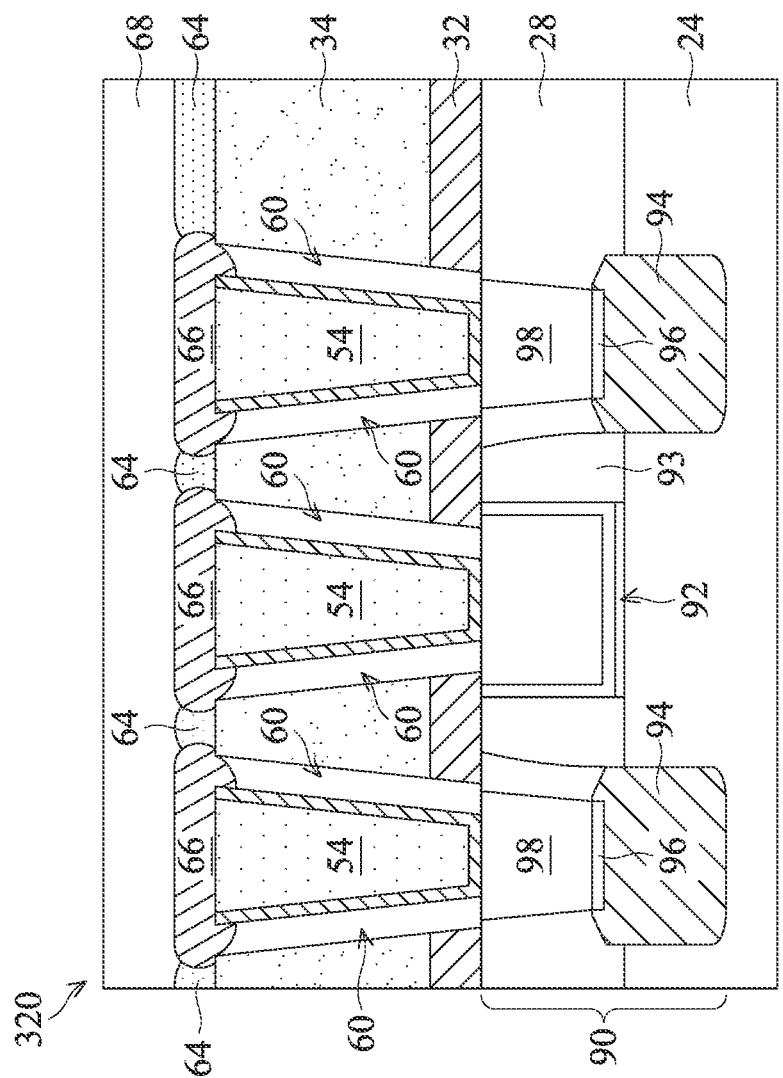
FIG. 18 illustrates a cross-sectional view of a package component including a transistor connected to conductive features with air spacers, in accordance with some embodiments.

In accordance with some embodiments of the present disclosure, integrated circuit devices 26 are formed in the substrate 24 or on the substrate 24. The integrated circuit devices 26 may include various Complementary Metal-Oxide Semiconductor (CMOS) devices, N-type metal-oxide semiconductor (NMOS) and/or P-type metal-oxide semiconductor (PMOS) devices, such as transistors (e.g., planar transistors, Fin Field-Effect Transistors (FinFETs), Nanostructure FETs (NFETs/NSFETs), or the like), capacitors, resistors, diodes, photodiodes, fuses, or the like. One of ordinary skill in the art will appreciate that the above examples are provided for the purpose of illustration only and are not meant to limit the present disclosure in any manner. Other circuitry may be also used as appropriate for a given application. The details of integrated circuit devices 26 are not illustrated in FIG. 1. As an example integrated circuit device, FIG. 18 illustrates a package component 320 including a transistor 90, described below.

In some embodiments, Shallow Trench Isolation (STI) regions (not shown) may be formed in the substrate 24 to isolate active regions in the substrate 24. Although not shown, through-vias may be (or may not be) formed to extend into substrate 24, wherein the through-vias are used to electrically interconnect features on opposite sides of the substrate 24.

Referring back to FIG. 1, an Inter-Layer Dielectric (ILD) 28 is formed over the substrate 24, in accordance with some embodiments. The ILD 28 may fill the space between the gate stacks of transistors (not shown in FIG. 1) in the integrated circuit devices 26. In some embodiments, the ILD 28 may comprise, for example, phosphosilicate glass (PSG), borophosphosilicate glass (BPSG), fluorosilicate glass (FSG), spin-on glass, spin-on polymers, silicon oxycarbide (SiOC), silicon carbide, compounds thereof, composites thereof, combinations thereof, or the like, and may be formed by any suitable method, such as spin-on coating, Flowable Chemical Vapor Deposition (FCVD), Chemical Vapor Deposition (CVD), Plasma-Enhanced CVD (PECVD), Atomic Layer Deposition (ALD), Low Pressure Chemical Vapor Deposition (LPCVD), a combination thereof, or the like.

Conductive features 30 are formed in the ILD 28, and may electrically connect the integrated circuit devices 26 to overlying conductive features such as metal lines or vias. The conductive features 30 may be contact plugs in some cases. In some embodiments, the conductive features 30 comprise one or more conductive materials such as tungsten, aluminum, copper, titanium, tantalum, titanium nitride, tantalum nitride, alloys therefore, or multi-layers thereof. The formation of the conductive features 30 may include forming contact openings in the ILD 28, filling one or more conductive materials into the contact openings, and performing a planarization process such as a Chemical Mechanical Polish (CMP) process or a mechanical grinding process to level the top surfaces of the conductive features 30 with the top surface of the ILD 28. Other materials or techniques are possible. In some embodiments, the techniques described In FIG. 2, an etch stop layer 32 is formed over the ILD 28 and the conductive features 30, in accordance with some embodiments. The etch stop layer 32 may extend on the top surfaces of the ILD 28 and the conductive features 30. In other embodiments, an interconnect structure (not shown) comprising one or more dielectric layers containing conductive features (such as contact plugs, metal lines, vias, etc.) may be located between the ILD 28 and the etch stop layer 32. For example, the interconnect structure may comprise one or more additional etch stop layers, additional ILDs, low-k dielectric layers, or the like, and the conductive features may be formed in these layers.

In some embodiments, the etch stop layer 32 may include silicon nitride (SiN), silicon carbide (SiC), silicon oxynitride (SiON), silicon oxycarbide (SiOC), silicon carbonitride (SiCN), a combination thereof, or the like. In some embodiments, the etch stop layer 32 may include a metal oxide, a metal nitride, or the like. The etch stop layer 32 may be formed from a single layer of material or may be formed from multiple layers of different materials. In accordance with some embodiments of the present disclosure, etch stop layer 32 includes an aluminum nitride (AlN) layer, a silicon oxy-carbide layer over the aluminum nitride layer, and an aluminum oxide layer over the silicon oxy-carbide layer.

Figure 2:
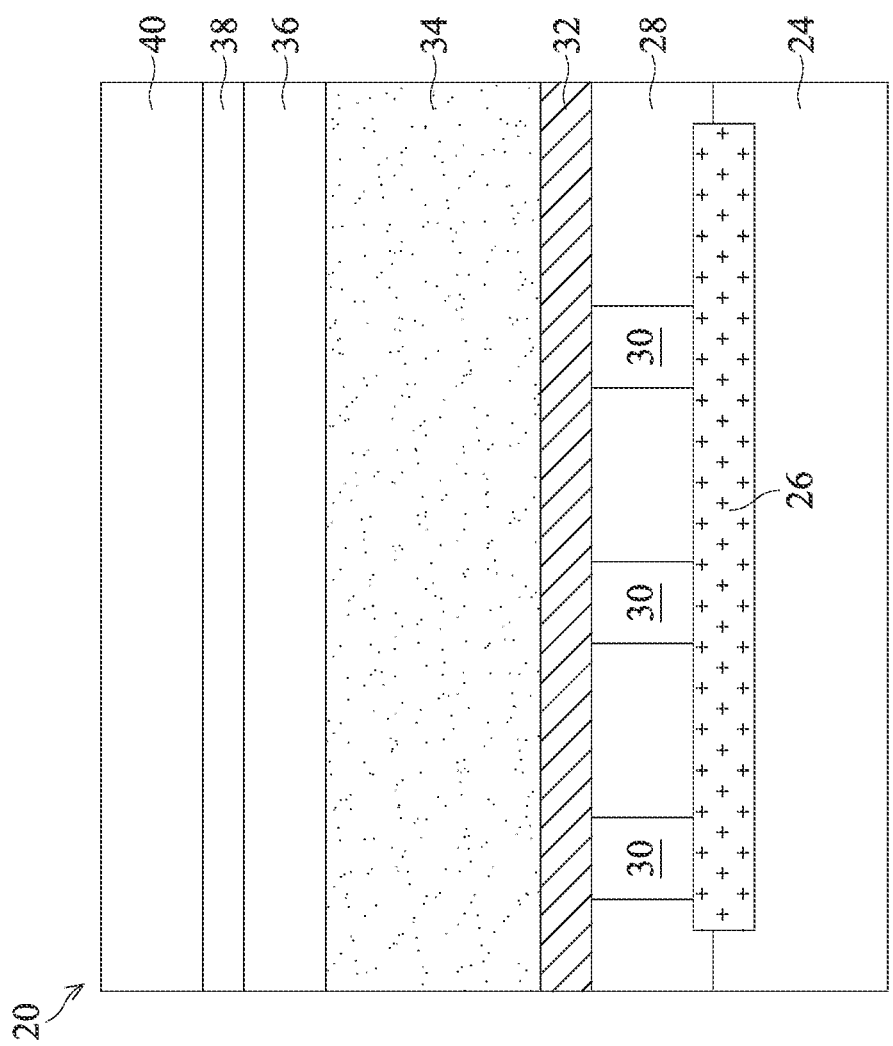

Still referring to FIG. 2, a dielectric layer 34 is deposited over the etch stop layer 32, in accordance with some embodiments. The dielectric layer 34 may be an ILD layer or an Inter-Metal Dielectric (IMD) layer. In some embodiments, the dielectric layer 34 may be formed using materials or techniques similar to those described previously for the ILD 28. In accordance with some embodiments of the present disclosure, dielectric layer 34 is formed of or comprises a low-k dielectric material having a dielectric constant (k value) lower than about 3.0.

A pad layer 36, a hard mask 38, and a photoresist 40 are formed over the dielectric layer 34, in accordance with some embodiments. The pad layer 36 may be, for example, a thin film comprising silicon oxide. In accordance with some embodiments of the present disclosure, the pad layer 36 is formed using Tetraethyl Orthosilicate (TEOS) as a precursor, and the deposition process may include PECVD, CVD, LPCVD, or the like. Other materials, precursors, or deposition techniques are possible. In some embodiments, the pad layer 36 acts as an adhesion layer between the dielectric layer 34 and the overlying hard mask 38. The pad layer 36 may also act as an etch stop layer for etching the hard mask 38. In accordance with some embodiments of the present disclosure, the hard mask 38 is formed of tungsten doped carbide (WDC), silicon nitride, titanium nitride, boron nitride, or the like. The deposition method may include CVD, LPCVD, PECVD, or the like. Other materials or techniques are possible. In some embodiments, the hard mask 38 is used as a hard mask during subsequent photolithography processes. The photoresist 40 may be deposited on the hard mask 38 using a suitable technique such as a spin-on process.

Figure 3:
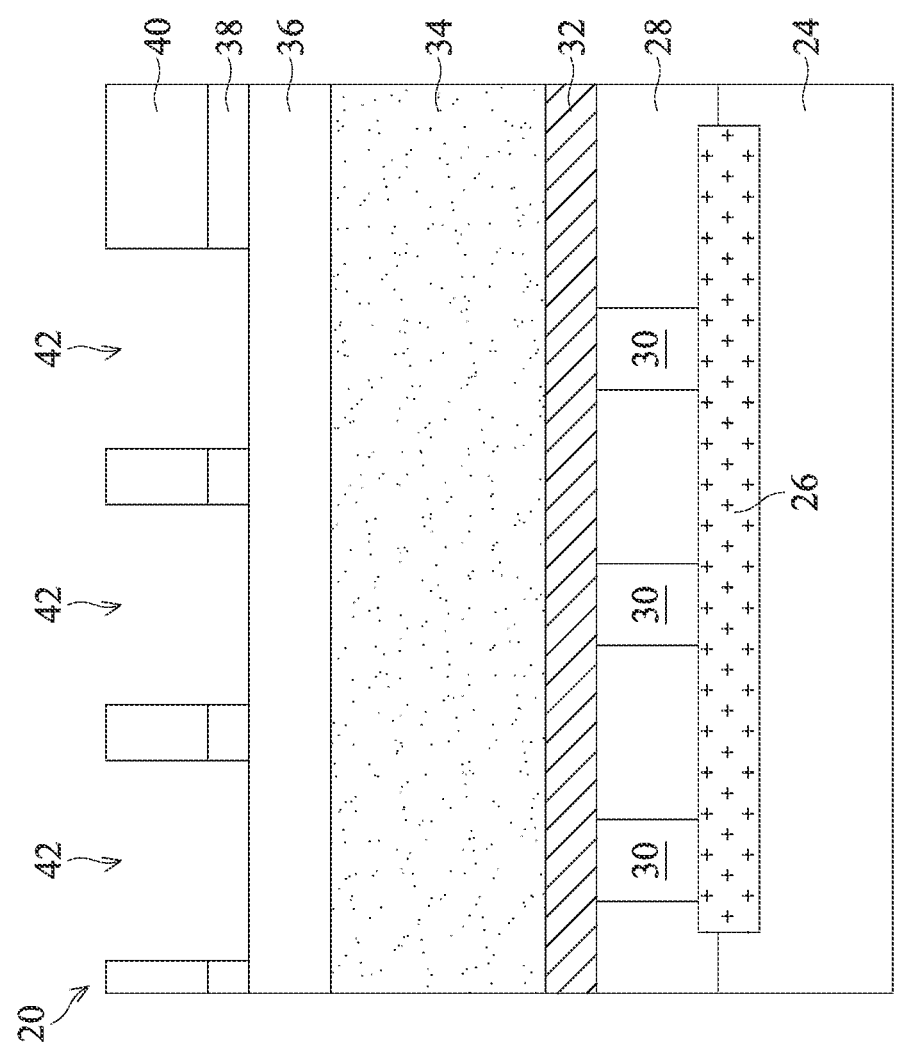

In FIG. 3, the photoresist 40 and the hard mask 38 are patterned, in accordance with some embodiments. The photoresist 40 may first be patterned to form openings 42 using suitable photolithography techniques. The hard mask 38 may then be patterned by etching the hard mask 38 using the patterned photoresist 40 as an etch mask. In some embodiments, the pad layer 36 may act as an etch stop layer for the etching of the hard mask 38. The patterning of the hard mask 38 extends the openings 42 to expose the pad layer 36. After the etching process, the photoresist 40 may be removed, using, for example, in an ashing process.

Figure 4:
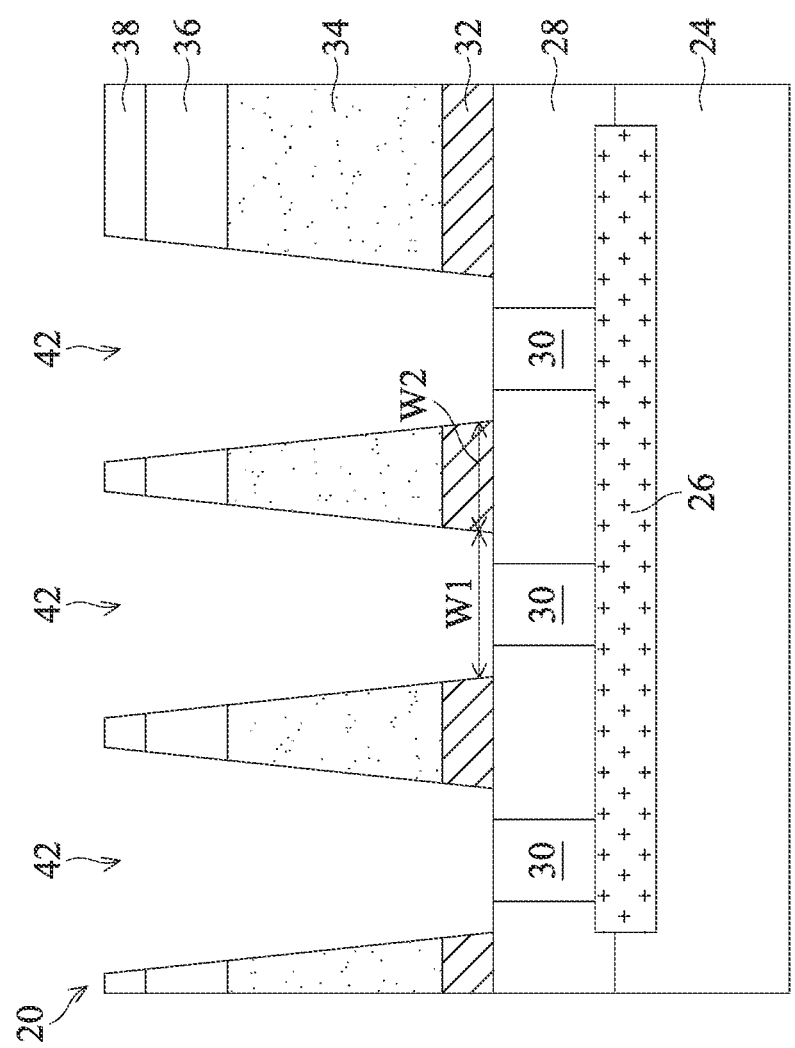

In FIG. 4, the pad layer 36 and the dielectric layer 34 are etched using hard mask 38 as an etching mask, in accordance with some embodiments. In this manner, the openings 42 are extended into dielectric layer 34. The pad layer 36 may be etched, for example, using a suitable dry etching process. In some embodiments, the dry etching process uses a mixture of $NF_3$ and $NH_3$ gases, a mixture of HF and $NH_3$ gases, or the like. Alternatively, the pad layer 36 may be etched using a wet etching process such as a wet etching process using an HF solution. In accordance with some embodiments of the present disclosure, the dielectric layer 34 may be etched using a process gas comprising fluorine and carbon. For example, the process gases for the etching may comprise fluorine- and carbon-containing gases such as $C_4F_8$, $CH_2F_2$, $CH_4$, $CH_3F$, and/or $CF_4$, or the like. In some embodiments, a carrier gas such as Ar, $N_2$, or the like may be utilized. The etching may be anisotropic, and other gases, etchants, or techniques are possible.

In some embodiments, the etching of the dielectric layer 34 may stop on the etch stop layer 32. The etch stop layer 32 may then be etched to extend the openings 42 through the etch stop layer 32. The etching process used to etch the etch stop layer 32 may be selected according to the materials and the layers of the etch stop layer 32. For example, in embodiments in which the etch stop layer 32 comprises aluminum oxide, silicon oxycarbide, aluminum nitride, or the like, the etching process may use gases such as $BCl_3$, $Cl_2$, $CF_4$, $CHF_3$, or the like. In some embodiments, gaseous oxygen ($O_2$) may be added. Other materials or etching processes are possible. In other embodiments, the etch stop layer 32 may not be present, or the dielectric layer 34 and the etch stop layer 32 may be etched using the same etching process.

After etching the etch stop layer 32, the openings 42 may expose the conductive features 30. In some embodiments, the openings 42 may expose portions of the dielectric layer 28 in addition to the conductive features 30. In this manner, the bottom of the openings 42 may have a width W1 that is wider than, narrower than, or about the same as a width of the conductive features 30. In some embodiments, the width W1 of the openings 42 may be in the range of about 10 nm to about 60 nm, though other widths are possible. The openings 42 are shown as having sloped sidewalls, but in other cases the openings 42 may have substantially vertical sidewalls, concave sidewalls, convex sidewalls, the like, or a combination thereof. In some embodiments, a width W2 between adjacent openings 42 may be in the range of about 10 nm to about 40 nm, though other widths are possible. In some cases, adjacent openings 42 may be separated by multiple widths, such as shown in FIG. 4 in which a width W2 near the bottom of adjacent openings 42 is greater than a width near the top of the adjacent openings 42.

Figure 5:
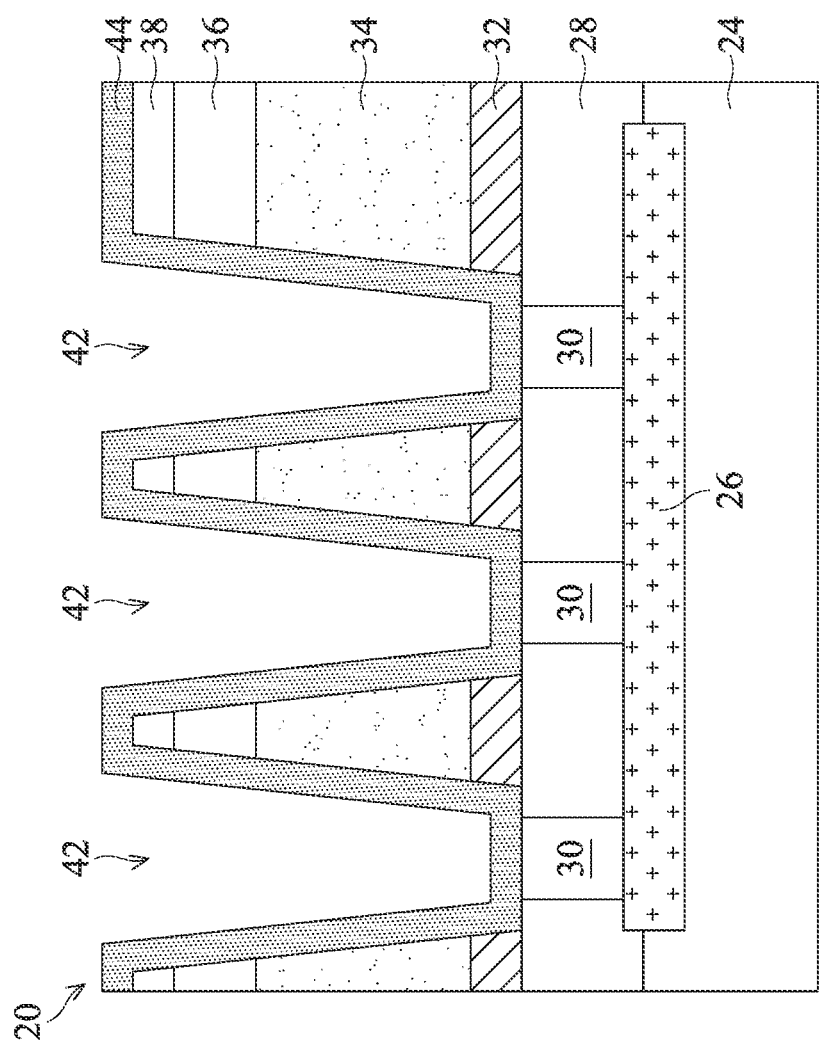

In FIG. 5, a sacrificial layer 44 is deposited in the openings 42, in accordance with some embodiments. The sacrificial layer 44 may comprise a material that can be selectively removed in a subsequent process, such as by using a selective etching process. In accordance with some embodiments, sacrificial layer 44 may be formed of a semiconductor such as silicon, or a dielectric material such as titanium oxide, silicon nitride, titanium nitride, a carbon-based material, the like, or a combination thereof. The deposition may be performed, for example, using a suitable conformal deposition process such as CVD, ALD, PVD, PECVD, or the like. Accordingly, the horizontal portions and vertical portions of the sacrificial layer 44 may have approximately the same thickness. In some embodiments, the sacrificial layer 44 may be deposited to a thickness in the range of about 1 nm to about 3 nm, though other thicknesses are possible. In other cases, different regions of the sacrificial layer 44 may have different thicknesses.

Figure 6:
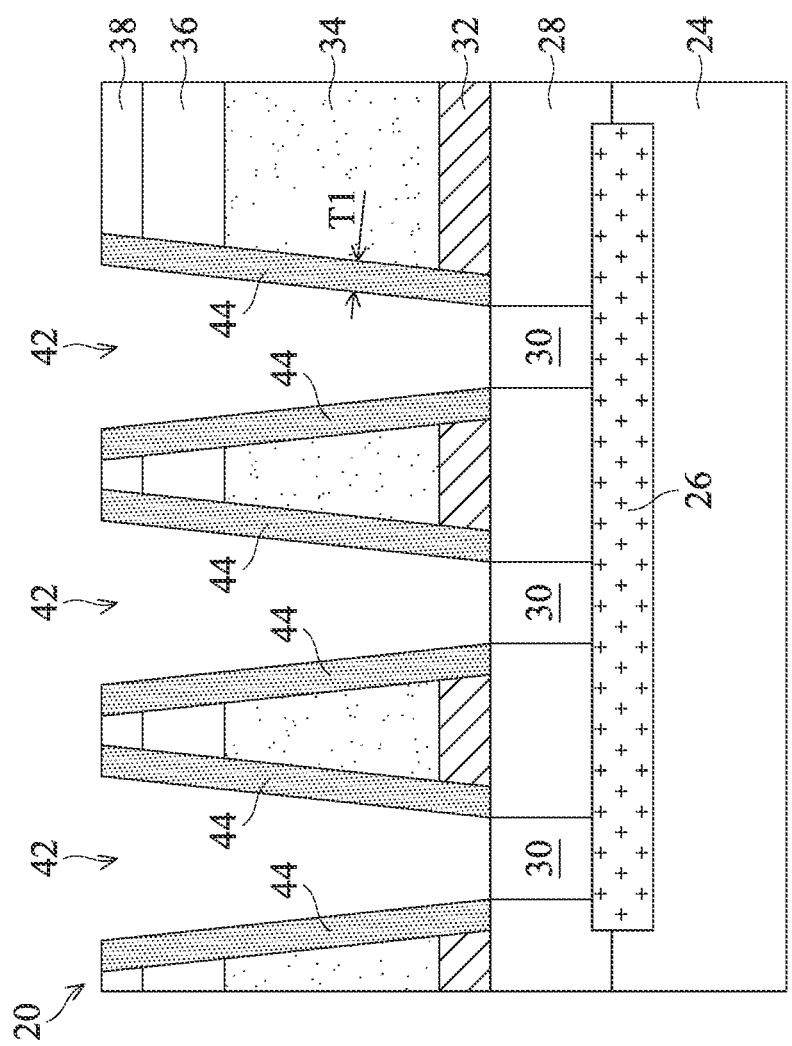

In FIG. 6, an anisotropic etching process is performed to remove horizontal portions of the sacrificial layer 44, in accordance with some embodiments. The anisotropic etching process may comprise, for example, a dry etching process using a directional plasma. In some embodiments, the dry etching process may use process gases such as $C_xF_y$, or the like. In some embodiments, the dry etching process may use a process pressure in the range of about 2 mTorr to about 50 mTorr, a bias voltage in the range of about 50 V to about 800V, a process temperature in the range of about 25° C. to about 75° C., or a process power in the range of about 300 W to about 1500 W. Other process parameters, process gases, or techniques are possible. As a result of the anisotropic etching process, horizontal portions of the sacrificial layer 44 are removed. In this manner, the conductive features 30 may be exposed within the openings 42. The vertical portions of the sacrificial layer 44 may remain on the sidewalls of the openings 42, as shown in FIG. 6. Accordingly, remaining portions of the sacrificial layer 44 may contact the sidewalls of the etch stop layer 32, the dielectric layer 34, the pad layer 36, and the hard mask 38, in some embodiments. In some embodiments, the remaining portions of the sacrificial layer 44 may have a thickness T1 that is in the range of about 0.5 nm to about 3 nm, though other thicknesses are possible.

Figure 7:
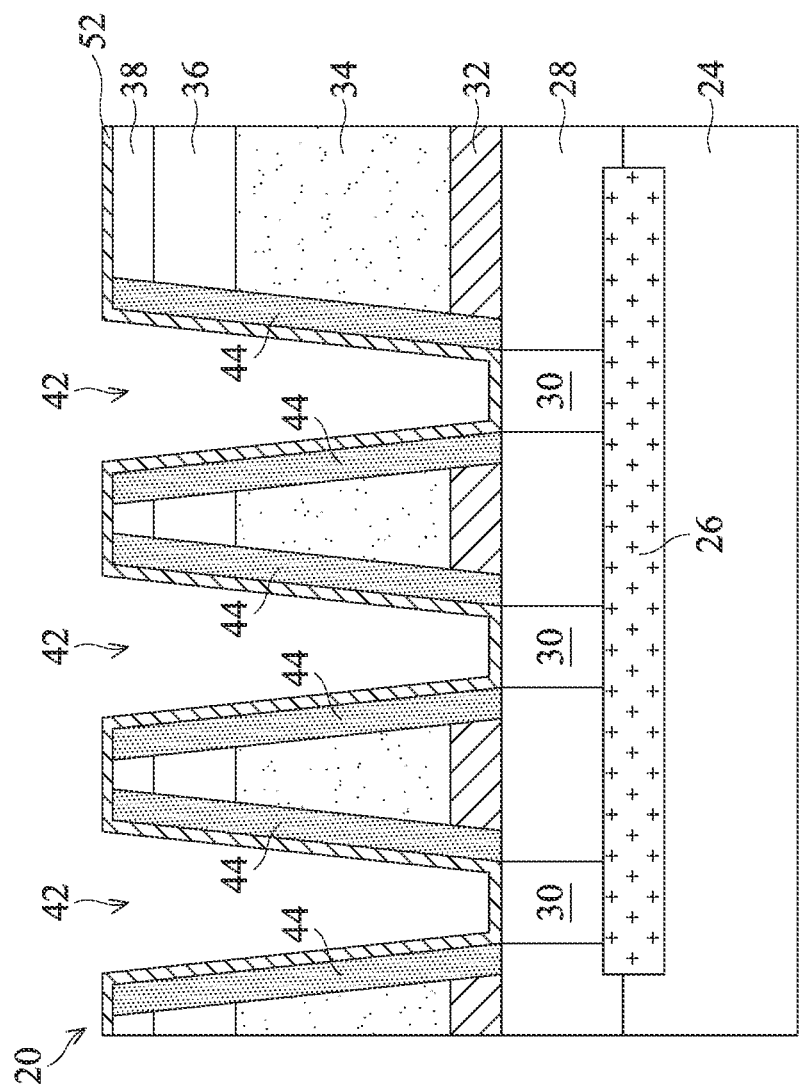
Figure 8:
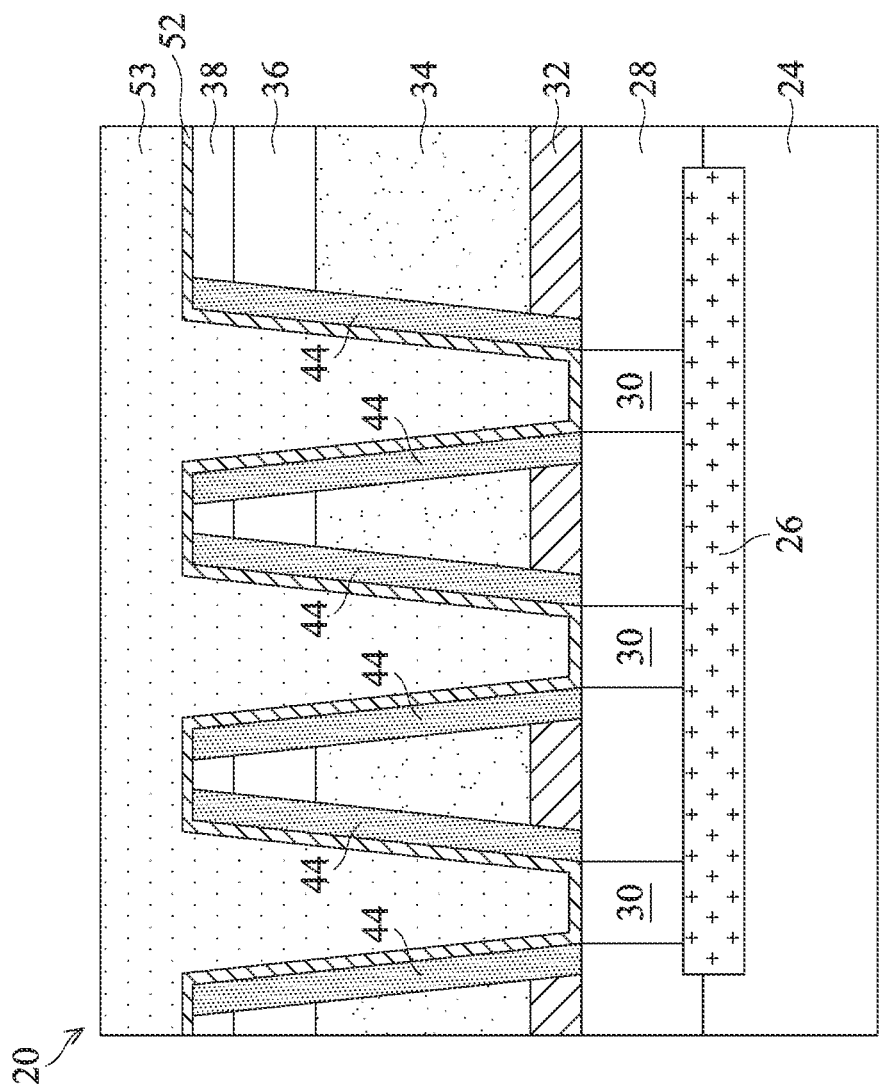
Figure 9:
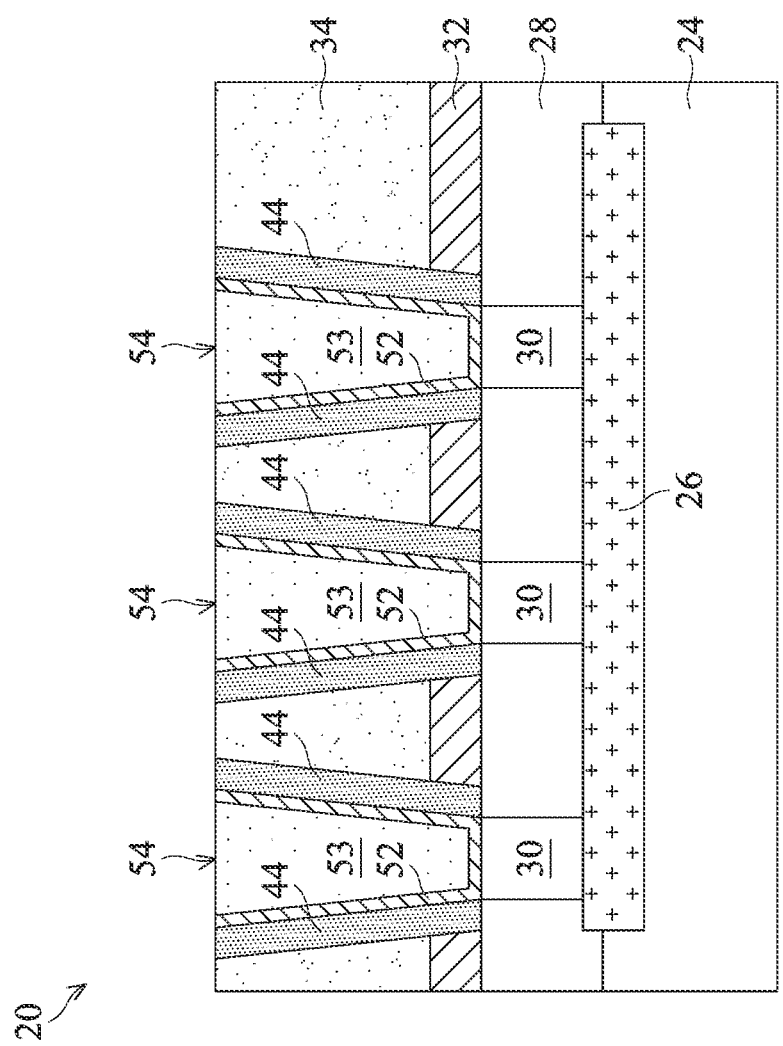

FIGS. 7 through 9 illustrate intermediate steps in the formation of conductive features 54 (see FIG. 9), in accordance with some embodiments. Referring to FIG. 7, in some embodiments, a barrier layer 52 is deposited within the openings 42. The barrier layer 52 may cover sidewalls of the sacrificial layer 44 within the openings 42 and may cover the exposed surfaces of the conductive features 30 within the openings 42. The barrier layer 52 may comprise a single layer of material or multiple layers of different materials. In accordance with some embodiments, the barrier layer 52 is comprises cobalt, ruthenium, titanium, titanium nitride, tantalum, tantalum nitride, indium oxide, tungsten nitride, the like, or a combination thereof. In some embodiments, the barrier layer 52 may be formed as a conformal layer, which may be deposited using a suitable technique such as CVD, ALD, PVD, or the like. Other materials or techniques are possible. In some embodiments, the barrier layer 52 is deposited having a thickness that is in the range of about 10 Å to about 40 Å. Other thicknesses are possible. In other embodiments, the barrier layer 52 is not formed.

In FIG. 8, a conductive material 53 is deposited in the openings 42, in accordance with some embodiments. The conductive material 53 covers the barrier layer 52, and may fill or overfill the openings 42. In some embodiments, the conductive material 53 comprises copper or a copper alloy, cobalt, tungsten, aluminum, ruthenium, the like, or combinations thereof. The conductive material 53 may be formed using a suitable technique such as plating, CVD, or the like. For example, in some embodiments, the conductive material 53 may be formed by first depositing a seed layer (not shown) over the barrier layer 52 and then forming the conductive material 53 on the seed layer using a plating process. Other materials or techniques are possible.

In FIG. 9, a planarization process is performed to remove excess portions of the conductive material 53 and barrier layer 52 to form the conductive features 54, in accordance with some embodiments. The planarization process may include, for example, a Chemical Mechanical Polish (CMP) process and/or a mechanical grinding process.

In some embodiments, the planarization process may be stopped at the top surface of the dielectric layer 34 or at the top surface of pad layer 36. In some embodiments, the planarization process may remove a top portion of the dielectric layer 34. In some embodiments, after performing the planarization process, top surfaces of the dielectric layer 34, the sacrificial layer 44, the barrier layer 52, and the conductive material 53 are substantially level. The portions of the conductive material 53 and the barrier layer 52 that remain after performing the planarization process are collectively referred to herein as the conductive features 54. The conductive features 54 may include, for example, metal lines, metal vias, contact plugs, or the like. In some embodiments, each conductive feature 54 is encircled by the sacrificial layer 44.

Figure 10:
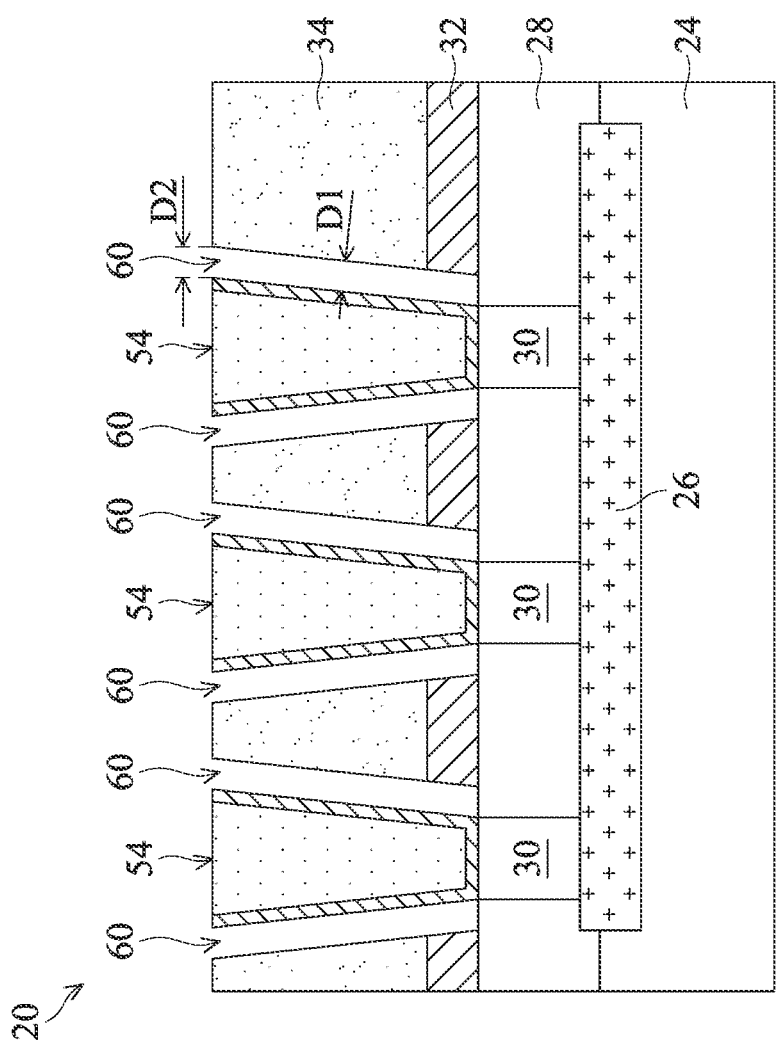

In FIG. 10, the sacrificial layer 44 is removed to form air spacers 60, in accordance with some embodiments. In some embodiments, the air spacers 60 are gaps (e.g., "air gaps") that at least partially surround corresponding conductive features 54. The relatively low k value of the air within the air spacers 60 can reduce capacitance (e.g., parasitic capacitance) associated with the conductive features 54, which can improve device speed, reduce electrical noise, and/or improve device performance.

In some embodiments, the sacrificial layer 44 is removed using an etching process, such as a dry etching process and/or a wet etching process. The etching process may be isotropic, in some embodiments. As an example, a wet etching process may include $H_3PO_4$ in some embodiments in which the sacrificial layer 44 comprises silicon nitride. Other etchants, materials, or techniques are possible. In some embodiments, the air spacers 60 have a width D1 that is in the range of about 1 nm to about 3 nm, though other widths are possible. In some cases, the width D1 of the air spacers 60 is approximately the same as the thickness T1 of the sacrificial layer 44 (see FIG. 6). In some cases, the air spacers 60 have a substantially uniform width D1. In some embodiments, the air spacers 60 may have a top width D2 that is in the range of about 1 nm and about 3 nm. The top width D2 may be approximately the same as the width D1, in some cases. In some embodiments, the air spacers 60 have a vertical height that is in the range of about 3 nm to about 30 nm though other heights are possible.

Figure 11:
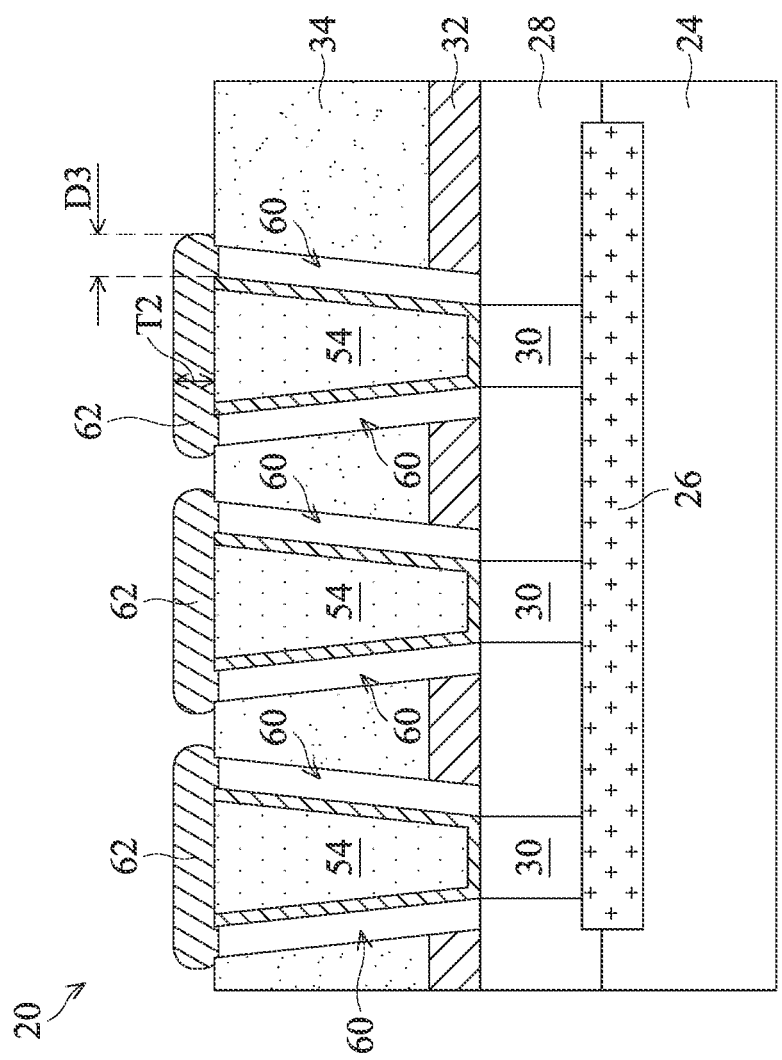

FIGS. 11 through 14 illustrate intermediate steps in the formation of metal caps 66 (see FIG. 14) over the conductive features 54, in accordance with some embodiments. Referring to FIG. 11, an inhibitor material 62 is formed over the conductive features 54 and the air spacers 60, in accordance with some embodiments. The inhibitor material 62 may inhibit the formation of subsequently deposited layers, such as the first etch stop material 64 (see FIG. 12). For example, the inhibitor material 62 may have a steric effect that prevents or reduces growth of one or more subsequent materials on the inhibitor material 62.

In some embodiments, the inhibitor material 62 is chosen such that the molecules of the inhibitor material 62 bond to the metal of the conductive features 54 but do not bond to the dielectric material of the dielectric layer 34. In this manner, the inhibitor material 62 may be selectively deposited on surfaces of the conductive features 54 and not deposited on surfaces of the dielectric layer 34. In some embodiments, the inhibitor material 62 may comprise a silane, an alkyne, or the like. In some embodiments, the inhibitor material 62 may comprise an acid, such as a phosphoric acid, a carboxylic acid, or another type of acid. The inhibitor material 62 may be formed using a suitable process, such as by a wet process (e.g., immersion in a wet chemical mixture) or by a dry process (e.g., exposure to a gas mixture).

In some embodiments, the inhibitor material 62 comprises a silane compound or the like. For example, the inhibitor material 62 may be a silane compound deposited using gaseous silane ($SiH_4$) or the like as a process gas. Other inhibitor materials or deposition gases are possible. In some embodiments, the inhibitor material 62 comprises an organic polymer, such as a polyimide; a polyamide; a carbon-containing compound such as $C_2H_2$, another alkyne, or the like; the like; or a combination thereof. In some embodiments, a polyimide may be deposited using pyromellitic dianhydride and 1,6-diaminohexane as precursors, or a polyamide may be deposited using ethylene diamine and adipoyl chloride as precursors. Other materials or precursors are possible. In some embodiments, the inhibitor 62 comprises a self-assembled monolayer (SAM) material, such as a SAM material containing carbon.

In some embodiments, the inhibitor material 62 may comprise a phosphoric acid such as orthophosphoric acid, di-(2-ethylhexyl)phosphoric acid, dihexylphosphoric acid, ethyl hexadecyl phosphate, n-butyl-octyl-hydrogenphosphate, diisoamylphosphoric acid, ethyl octyl phosphate, the like, or combinations thereof. However, any suitable phosphoric acid may be utilized. In some embodiments, an inhibitor material 62 comprising one or more phosphoric acids may be deposited by exposing the structure to a wet chemical mixture comprising the one or more phosphoric acids. In some embodiments, the wet chemical mixture may include a solvent such as ethylene glycol, diethylene glycol, N-(2-hydroxyethyl)-2-pyrrolidone (HEP), dimethyl sulfoxide (DMOS), sulfolane, isopropanol, acetone, tert-butanol, another organic solvent, the like, or a combination thereof. In some embodiments, the wet chemical mixture may be used for a duration of time in the range of about 30 seconds to about 20 minutes or at a temperature in the range of about 20° C. to about 300° C. Other materials, parameters, or techniques are possible.

In some embodiments, the inhibitor material 62 may comprise a carboxylic acid such as propanoic acid, butanoic acid, pentanoic acid, hexanoic acid, heptanoic acid, octanoic acid, nonanoic acid, the like, or combinations thereof. However, any suitable carboxylic acid may be utilized. In some embodiments, an inhibitor material 62 comprising one or more carboxylic acids may be deposited by exposing the structure to a wet chemical mixture comprising the one or more carboxylic acids. In some embodiments, the wet chemical mixture may include a solvent such as those described above. In some embodiments, the wet chemical mixture may be used for a duration of time in the range of about 30 seconds to about 20 minutes or at a temperature in the range of about 30° C. to about 300° C. Other materials, parameters, or techniques are possible.

As described previously, the inhibitor material 62 may be selectively formed on the conductive features 54. In some embodiments, the inhibitor material 62 may be formed on the conductive features 54 such that portions of the inhibitor material 62 protrude laterally from the top surfaces of the conductive features 54 and extend over the air spacers 60. For example, the inhibitor material 62 may protrude partially or completely over an air spacer 60. For example, in some embodiments, the inhibitor material 62 may extend a lateral distance D3 over an air spacer 60 from a corresponding edge of a conductive feature 54, in which the lateral distance D3 is in the range of about 0 nm to about 3 nm. In some embodiments, the lateral distance D3 is between about 10% and about 120% of the top width D2 of the air spacer 60 (see FIG. 10). Other lateral distances are possible. Accordingly, in some embodiments, the inhibitor material 62 may extend completely across an air spacer 60 and physically contact the top surface of the dielectric layer 34. In this manner, in some embodiments, the inhibitor material 62 may at least temporarily seal the air spacers 60. In some embodiments, the laterally protruding portions of the inhibitor material 62 may have a convex or rounded sidewall surface, as shown in FIG. 11. In other embodiments, the sidewall surface of the laterally protruding inhibitor material 62 may have a different profile, such as vertical, sloped, straight, angled, concave, etc.

In some embodiments, the inhibitor material 62 on the conductive features 54 has a thickness T2 that is in the range of about 10 Å to about 40 Å. Other thicknesses are possible. In some embodiments, the lateral protrusion distance D3 of the inhibitor material 62 may be controlled by controlling the thickness T2 of the inhibitor material 62. For example, an inhibitor material 62 formed having a greater thickness T2 may also have a greater lateral distance D3.

In some embodiments, the inhibitor material 62 protruding laterally over an air spacer 60 has a bottom surface that protrudes vertically down into the air spacer 60 (e.g., is below a top surface of the conductive feature 54 and/or below a top surface of the dielectric layer 34). In some embodiments, the inhibitor material 62 protruding down into an air spacer 60 may physically contact a sidewall of the conductive feature 54 (e.g., the barrier layer 52) within the air spacer 60 and/or the sidewall of the dielectric layer 34 within the air spacer 60. In some embodiments, the inhibitor material 62 protrudes down into an air spacer 60 without physically contacting the sidewalls of the air spacer 60. In some embodiments, the inhibitor material 62 protrudes down into an air spacer 60 a distance that is in the range of about 0 nm to about 3 nm from a top surface of the dielectric layer 34, though other distances are possible. In other embodiments, the inhibitor material 62 has a bottom surface that does not protrude down into the air spacer 60. In other words, the inhibitor material 62 may have a bottom surface that is approximately level with or above a top surface of the conductive feature 54 and/or a top surface of the dielectric layer 34.

Figure 12:
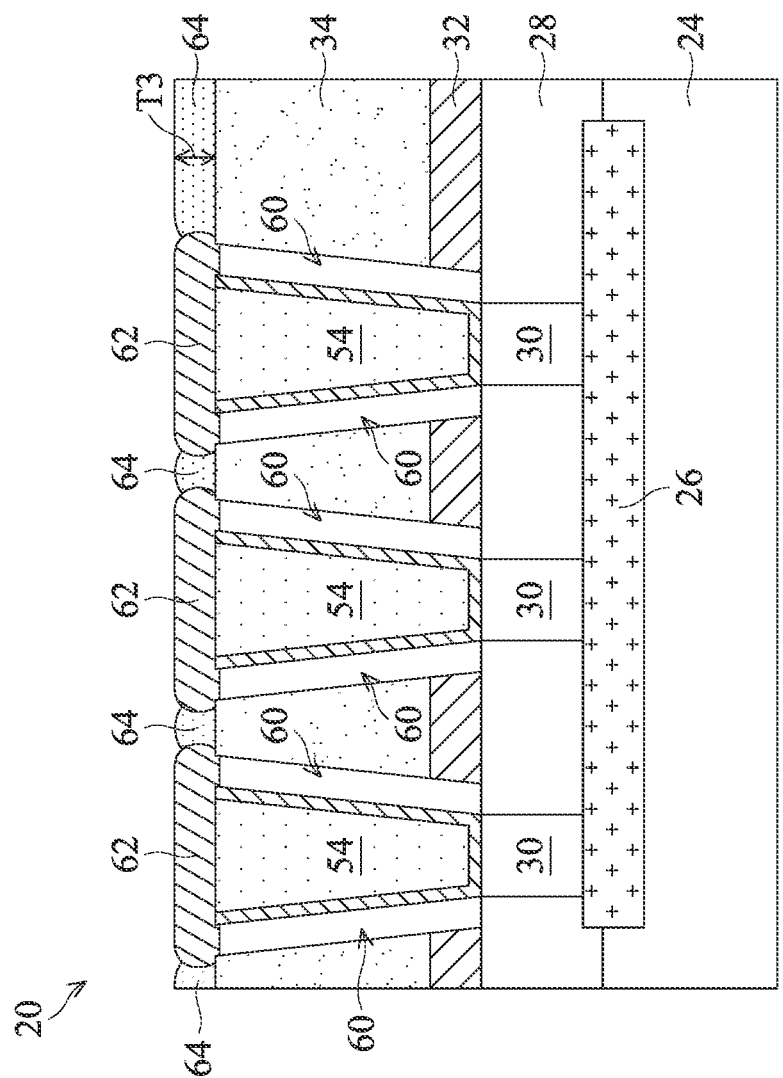

In FIG. 12, a first etch stop material 64 is formed, in accordance with some embodiments. As mentioned previously, in some embodiments, the inhibitor material 62 has a steric effect that prevents or reduces growth of the first etch stop material 64 on the inhibitor material 62. In this manner, the first etch stop material 64 may be selectively formed on surfaces of the dielectric layer 34 rather than on surfaces of the inhibitor material 62. For example, the first etch stop material 64 may be formed on exposed surfaces of the dielectric layer 34 between adjacent conductive features 54.

In some embodiments in which the inhibitor material 62 extends partially or fully over the air spacers 60, the presence of the inhibitor material 62 may block the first etch stop material 64 from forming over the air spacers 60 and/or within the air spacers 60. In some embodiments in which the inhibitor material 62 does not extend fully across the air spacers 60, portions of the first etch stop material 64 may extend over the air spacers 60 and/or protrude down into the air spacers 60. In some embodiments, the inhibitor material 62 has convex sidewalls, and the first etch stop material 64 has correspondingly concave sidewalls. This is the embodiment illustrated in FIG. 12. Other sidewall profiles are possible.

The first etch stop material 64 may be formed from a single layer of material or may be formed from multiple layers of different materials. In some embodiments, the first etch stop material 64 may include a metal oxide, a metal nitride, the like, or a combination thereof. The material(s) of the first etch stop material 64 may be chosen to have little or no growth on the inhibitor material 62. For example, the first etch stop material 64 may comprise one or more layers of aluminum oxide, aluminum nitride, aluminum oxynitride, zirconium oxide, the like, or a combination thereof. The first etch stop material 64 may be formed using a suitable technique, such as ALD or the like. Other materials or deposition techniques are possible. In some embodiments, the first etch stop material 64 may be formed to a thickness T3 in the range of about 10 Å to about 50 Å, though other thicknesses are possible. The first etch stop material 64 may have a thickness T3 that is less than, about the same as, or greater than the thickness T2 (see FIG. 11) of the inhibitor material 62.

Figure 13:
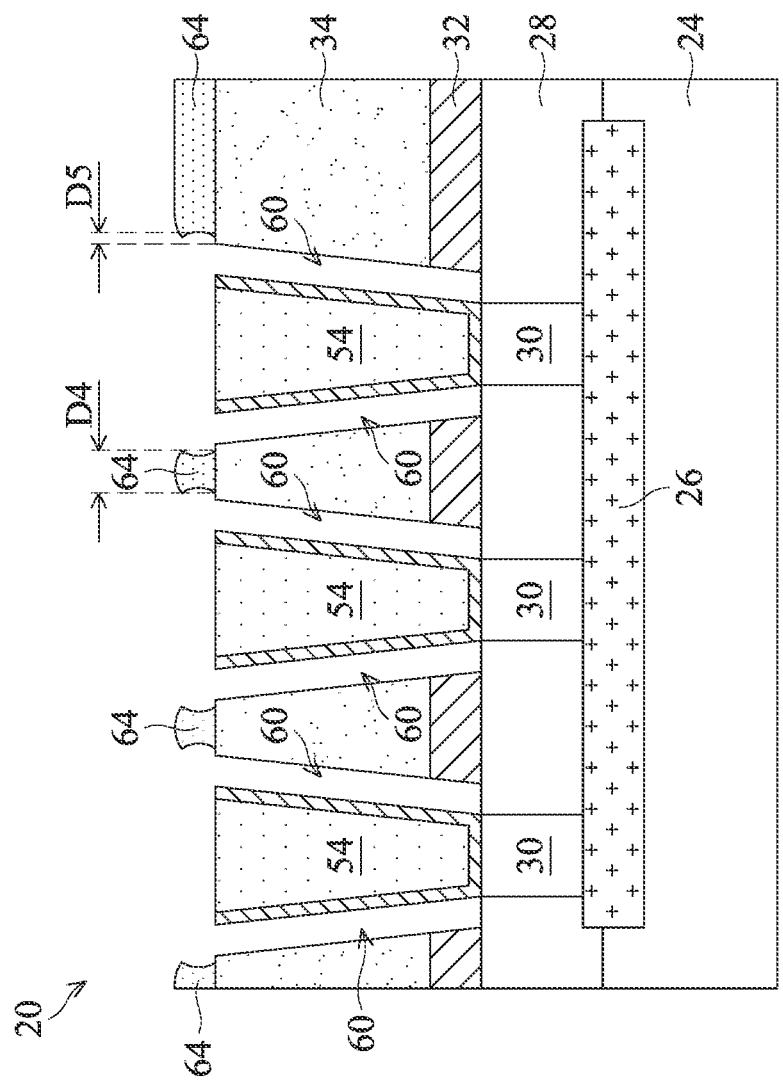

In FIG. 13, the inhibitor material 62 is removed to expose the conductive features 54 and the air spacers 60, in accordance with some embodiments. The inhibitor material 62 may be removed using a process that removes the inhibitor material 62 and does not remove the first etch stop material 64. For example, in some embodiments, the inhibitor material 62 may be removed using a thermal process. In some embodiments, the thermal process uses a process temperature that is in the range of about 200° C. to about 400° C. In some embodiments, the thermal process is performed for a duration of time in the range of about 30 seconds to about 30 minutes. Other temperatures or times are possible. In some embodiments, the thermal process uses one or more process gases such as $N_2$, He, Ar, the like, or a combination thereof. Other processes for removing the inhibitor material are possible, such as etching processes, wet chemical processes, dry processes, etc.

In some embodiments, removing the inhibitor material 62 exposes portions of the conductive features 54 and/or the air spacers 60 that were previously covered by the inhibitor material 62. In some embodiments, the convex sidewalls of the inhibitor material 62 can result in the first etch stop material 64 to have sidewalls with a concave profile, as shown in FIG. 13. Other sidewall profiles are possible, as described previously. In some embodiments, after removing the inhibitor material 62, portions of the first etch stop material 64 between adjacent conductive features 54 may have a width D4 that is in the range of about 15 nm to about 50 nm, though other widths are possible. In some embodiments, the portions of the first etch stop material 64 between adjacent conductive features 54 separate and isolate adjacent metal caps 66 (see FIG. 14).

After removing the inhibitor material 62, the first etch stop material 64 may have sidewalls protruding beyond sidewalls of the dielectric layer 34 (e.g., overhanging the air spacers 60), may have sidewalls that are approximately flush with sidewalls of the dielectric layer 34, or may have sidewalls that are recessed from sidewalls of the dielectric layer 34. In some embodiments, after removing the inhibitor material 62, the first etch stop material 64 may have a sidewall that is offset from a sidewall of the dielectric layer 34, represented in FIG. 13 by the distance D5. In some embodiments, first etch stop material 64 may have a sidewall that protrudes from a sidewall of the dielectric layer 34 a lateral distance that is between about 0 nm and about 2 nm. In some embodiments, first etch stop material 64 may have a sidewall that is recessed from a sidewall of the dielectric layer 34 a lateral distance (e.g., distance D5) that is between about 0 nm and about 1 nm. Other distances are possible.

In accordance with some embodiments, after removing the inhibitor material 62, an optional purging process may be performed using a process gas. In accordance with some embodiments, the process gas may include one or more gases such as $N_2$, He, Ar, the like, or a combination thereof. The purging process may be performed for a duration of time in the range of about 1 minute to about 10 minutes, though other times are possible. In addition, a thermal anneal process may be performed, which may be performed at the same time as the purging process, before the purging process, or after the purging process. The thermal anneal may use a process temperature in the range of about 300° C. to about 400° C., though other temperatures are possible. The purging process may remove moisture and prevent the oxidation of metal such as the exposed portions of the barrier layer 52. In some embodiments, the purging process is part of the process used to remove the inhibitor material 62. In other embodiments, the purging process is performed as a separate process, or is omitted.

Figure 14:
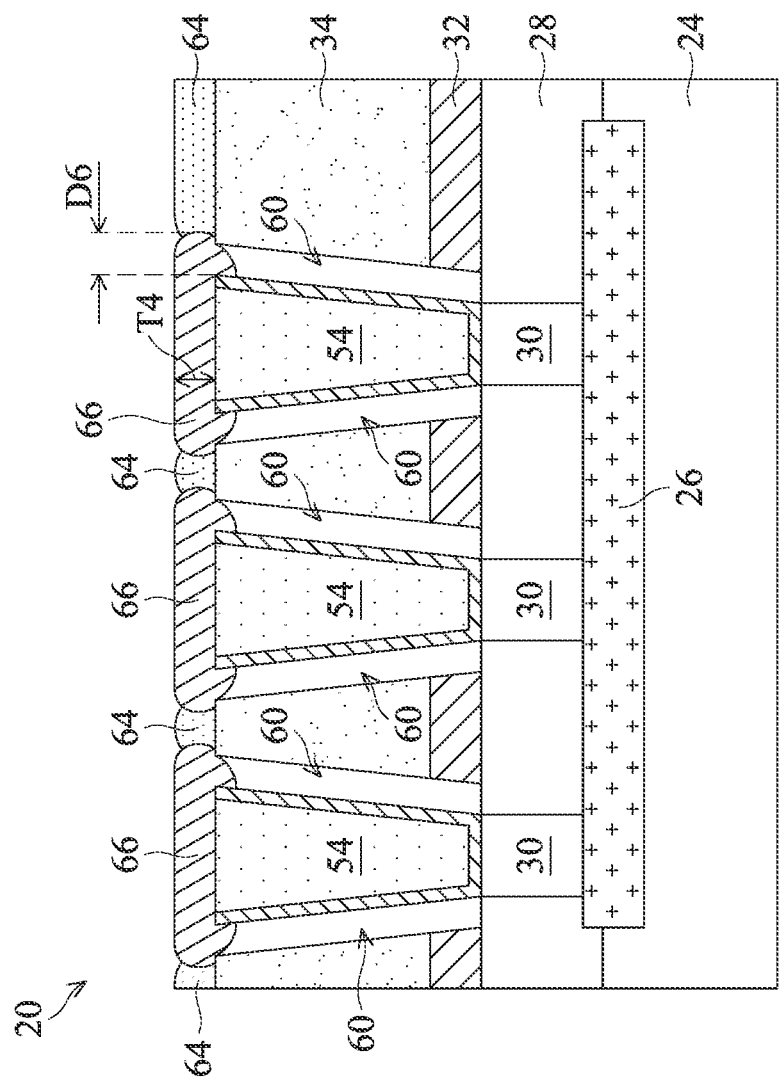

In FIG. 14, metal caps 66 are formed on the conductive features 54, in accordance with some embodiments. In some embodiments, the metal caps 66 are formed such that the material of the metal caps 66 extends partially or fully across the air spacers 60. In some embodiments, the material of the metal caps 66 is formed such that the material of the metal caps 66 laterally protrudes far enough to physically contact the sidewalls of the first etch stop material 64, as shown in FIG. 14. In this manner, the metal caps 66 may be formed to seal the air spacers 60.

In some embodiments, the metal caps 66 are formed through a selective deposition process, such that the metal caps 66 are selectively deposited on exposed surfaces of the conductive features 54 and not deposited on exposed surfaces of the first etch stop material 64. In accordance with some embodiments, the selective deposition process may be performed using a suitable technique such as ALD, CVD, or the like. In some embodiments, the metal caps 66 are formed of cobalt, tungsten CoWP, CoB, tantalum, nickel, molybdenum, titanium, iron, the like, or combinations thereof. In some embodiments, the metal caps 66 are deposited using a precursor comprising a metal halide (such as $WCl_5$ or the like) or a metal organic material and a reducing agent such as $H_2$ or the like. Other materials, techniques, or precursors are possible.

In some embodiments, the metal caps 66 may be formed on the conductive features 54 such that portions of the metal caps 66 protrude laterally from the top surfaces of the conductive features 54 and extend over the air spacers 60. For example, the metal caps 66 may protrude partially or completely over the air spacers 60. For example, in some embodiments, a metal cap 66 may extend a lateral distance D6 over an air spacer 60 from a corresponding edge of a conductive feature 54, in which the lateral distance D6 is in the range of about 0 nm to about 3 nm. In some cases, the distance D6 may be approximately the same as the distance D3 of the inhibitor material 62 (see FIG. 11). In some embodiments, the lateral distance D6 is between about 10% and about 110% of the top width D2 of the air spacer 60 (see FIG. 10). Other lateral distances are possible.

In some embodiments, the metal caps 66 may extend completely across the air spacers 60, sealing the air spacers 60. In some embodiments, a metal cap 66 may extend across an air spacer 60 and physically contact the dielectric layer 34 on the opposite side of the air spacer 60 and/or physically contact the first etch stop material 64 on the opposite side of the air spacer 60. In some embodiments, the laterally protruding portions of the metal caps 66 may physically contact the sidewall surfaces of the first etch stop material 64. In embodiments in which the sidewall surfaces of the first etch stop material 64 are concave, the sidewalls of the metal caps 66 may have correspondingly convex or rounded sidewall surfaces. In other embodiments, the sidewall surfaces of the metal caps 66 may have a different profile, such as vertical, sloped, straight, angled, concave, etc., which may or may not correspond to the sidewall surface profile of the first etch material 64. In some cases, by forming the metal caps 66 such that the sidewalls of the metal caps 66 extend along the sidewalls of the first etch stop material 64, the air spacers 60 may be more completely or robustly sealed by the metal caps 66. In some cases, forming the first etch stop material 64 to have concave sidewall surfaces as described herein may allow for even more complete or robust sealing of the air spacers 60 by the metal caps 66. In other embodiments, a metal cap 66 may overhang an air spacer 60 without physically contacting the dielectric layer 34 on the opposite side of the air spacer 60 and/or physically contacting the first etch stop material 64 on the opposite side of the air spacer 60. In these embodiments, the metal caps 66 may partially or incompletely seal the air spacers 60.

In some embodiments, portions of the metal caps 66 on the conductive features 54 may deposited to a thickness T4 that is in the range of about 10 Å to about 50 Å. Other thicknesses are possible. The metal caps 66 may have a thickness T4 that is less than, about the same as, or greater than the thickness T3 (see FIG. 12) of the first etch stop material 64. In some embodiments, the lateral protrusion distance D6 of the metal caps 66 may be controlled by controlling the thickness T4 of the metal caps 66. For example, metal caps 66 formed having a greater thickness T4 may also have a greater lateral distance D6. In some cases, the sidewalls of the first etch stop material 64 may limit the lateral growth of the metal caps 66.

In some embodiments, the material of the metal caps 66 may be formed on upper sidewall surfaces of the conductive features 54 in addition to top surfaces of the conductive features 54. In this manner, the portions of the metal caps 66 protruding laterally over the air spacers 60 may have bottom surfaces that protrude vertically down into the air spacers 60 (e.g., below a top surface of the conductive features 54 and/or below a top surface of the dielectric layer 34). In some embodiments, the portions of the metal caps 66 protruding vertically down into an air spacer 60 may physically contact a sidewall of the dielectric layer 34 within the air spacer 60. In some embodiments, the material of the metal caps 66 protrudes down into air spacers 60 without physically contacting the sidewalls of the air spacers 60. In some embodiments, the material of the metal caps 66 protrudes down into the air spacers 60 a distance that is in the range of about 0 nm to about 2 nm from a top surface of the dielectric layer 34, though other distances are possible. In other embodiments, the material of the metal caps 66 has a bottom surface that does not protrude down into the air spacers 60. In other words, the metal caps 66 may have a bottom surface that is approximately level with or above a top surface of the conductive feature 54 and/or a top surface of the dielectric layer 34.

By sealing the air spacers 60 using the metal caps 66 as described herein, the parasitic capacitances associated with the conductive features 54 may be improved. For example, the air spacers 60 have k values equal to 1.0, which is smaller than other dielectric materials, even low-k dielectric materials. In this manner, the use of air spacers 60 can reduce the parasitic capacitance between neighboring conductive features 54. The use of metal caps 66 to seal the air spacer 60 as described herein can allow for air spacers 60 to be formed having larger volumes. For example, in some cases, the metal caps 66 may seal the air spacers 60 while having little or no material of the metal caps 66 protruding down into the air spacers 60, and thus may form air spacers 60 having larger heights and correspondingly larger volumes. Forming air spacers 60 with larger volumes can reduce parasitic capacitance and improve device performance.

Additionally, by separating neighboring metal caps 66 with regions of the first etch stop material 64, the chance of leakage or shorting between the neighboring metal caps 66 may be reduced. In this manner, the width of the air spacers 60 (e.g., D1 or D2 of FIG. 10) may be increased without increasing the risk of leakage or shorting between metal caps 66. Increasing the width of the air spacers 60 can correspondingly increase the volume of the air spacers 60, which can reduce parasitic capacitance as described previously. In some cases, forming regions of the first etch stop material 64 between the metal caps 66 can allow for the pitch of the conductive features 54 to be reduced or the size of the conductive features 54 to be increased without increasing the risk of leakage or shorting between the metal caps 66. In this manner, the techniques described herein can allow for improved device performance, improved design flexibility, and improved manufacturing yield.

Figure 15:
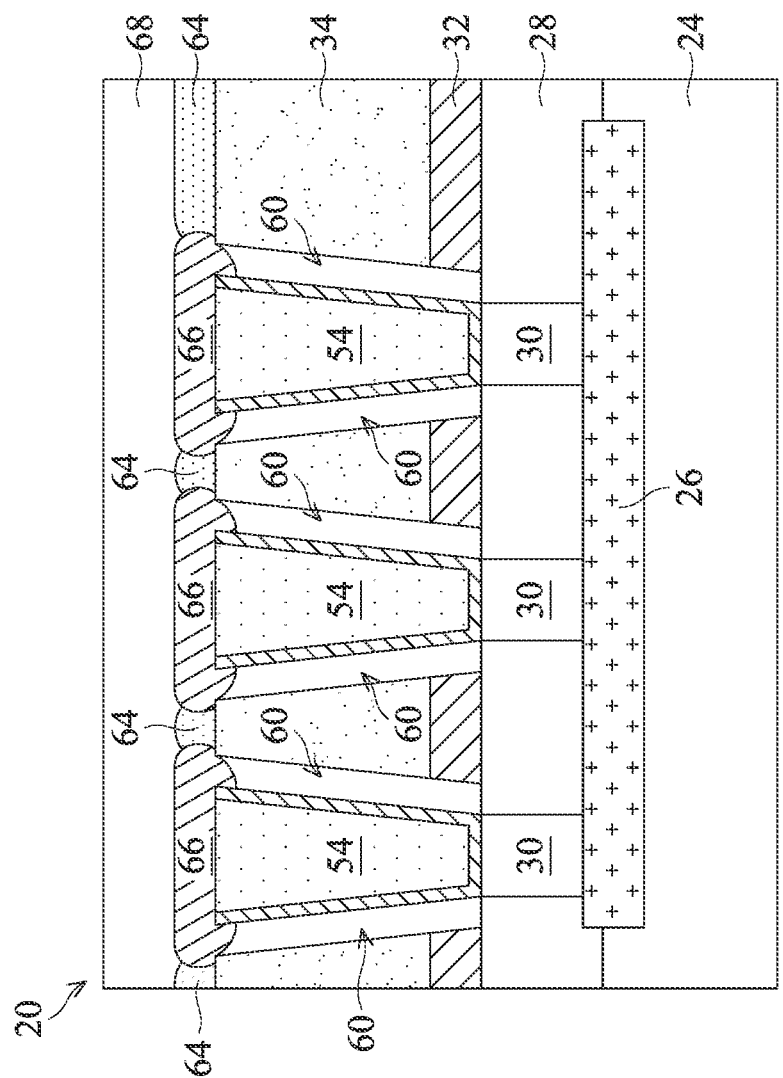

In FIG. 15, a second etch stop material 68 is formed over the metal caps 66 and the first etch stop material 64, in accordance with some embodiments. In embodiments in which the metal caps 66 completely seal the air spacers 60, the second etch stop material 68 is blocked from entering the air spacers 60 by the metal caps 66 and/or the first etch stop material 64. In other embodiments in which the metal caps 66 incompletely seal the air spacers 60, the second etch stop material 68 may enter the air spacers 60 and may seal the air spacers 60.

The second etch stop material 68 may be a single layer of material or may include multiple layers of different materials. In accordance with some embodiments, the second etch stop material 68 may comprise a material such as silicon nitride, silicon carbide, silicon oxy-nitride, silicon oxy-carbide, silicon carbo-nitride, the like, or a combination thereof. In some embodiments, the second etch stop material 68 may comprise a metal oxide (e.g., aluminum oxide or the like), a metal nitride (e.g., aluminum nitride or the like), the like, or a combination thereof. For example, in some embodiments, the second etch stop material 68 is a composite layer comprising a layer of aluminum nitride, a layer of silicon oxy-carbide over the aluminum nitride layer, and layer of aluminum oxide over the silicon oxy-carbide layer. In some embodiments, the second etch stop material 68 may include one or more materials similar to those of the first etch stop material 64. The second etch stop material 68 may be formed using one or more suitable techniques, such as ALD, CVD, or the like. Other materials, combinations of materials, or techniques are possible. In some embodiments, the second etch stop material 68 may have a thickness in the range of about 1 nm to about 20 nm, though other thicknesses are possible.

Figure 16:
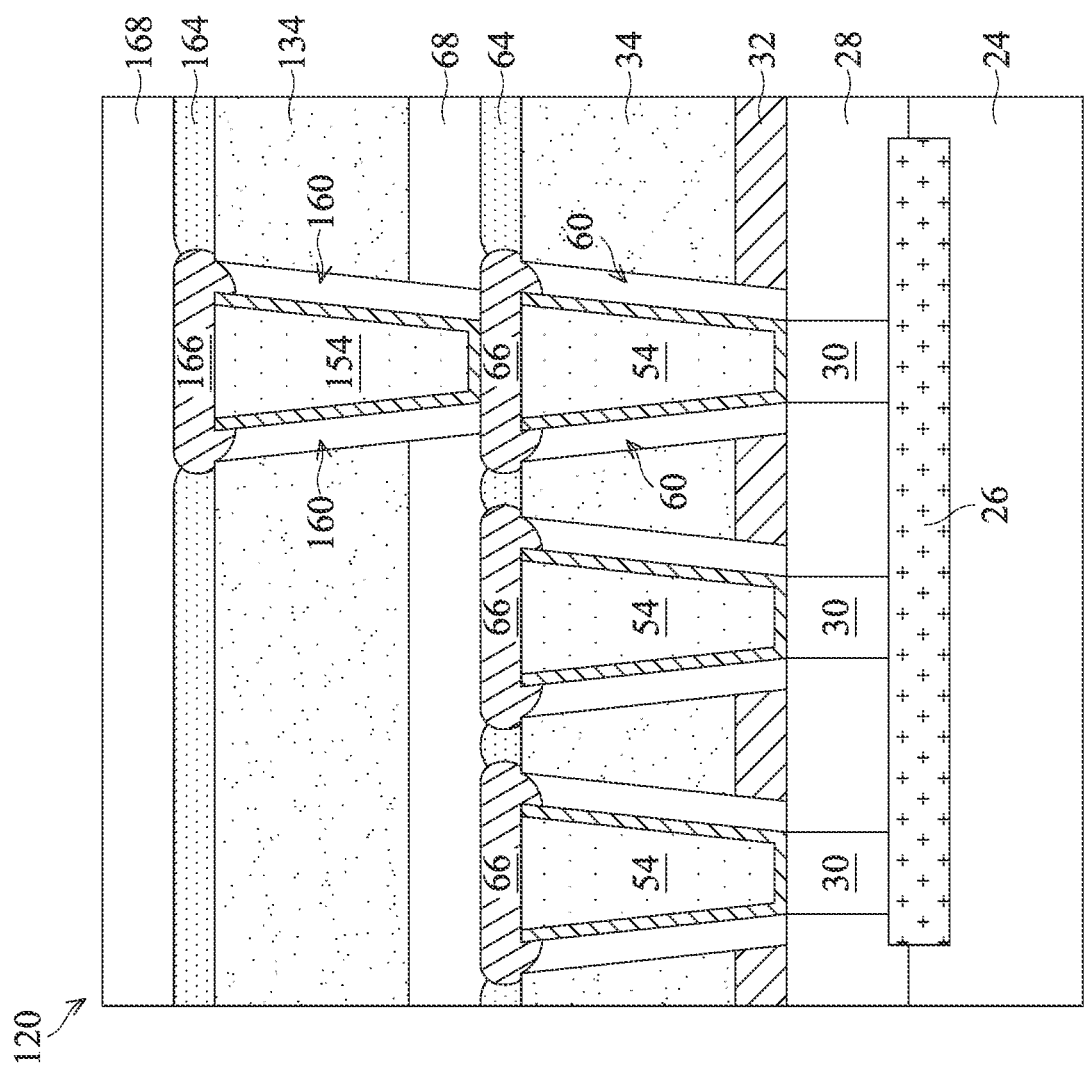
FIG. 16 illustrates a cross-sectional view of a package component including multiple layers of conductive features with air spacers, in accordance with some embodiments.

The embodiments described above for forming conductive features 54 with air spacers 60 may be utilized in multiple layers of a package component, device, or the like. As an example, FIG. 16 illustrates a package component 120 comprising conductive features with air spacers formed in multiple layers. The package component 120 is similar to the package component 20 described in FIGS. 1-16, except the package component 120 comprises additional layers of conductive features in addition to the conductive features 54. The package component 120 shown in FIG. 16 shows one additional conductive feature 154 as an illustrative example, but other embodiments may have multiple layers of additional conductive features, which may be metal lines, vias, contacts plugs, or the like.

The additional conductive features such as the conductive feature 154 may be formed using processes similar to those described for forming the conductive features 54. For example, a dielectric layer 134 may be deposited over the second etch stop material 68. The dielectric layer 134 may be similar to the dielectric layer 34 described previously for FIG. 2, and may be formed using similar materials or techniques. The dielectric layer 134 may be an ILD layer or an IMD layer, in some cases. After forming the dielectric layer 134, openings (not shown) may be patterned through the dielectric layer 134 and the second etch stop material 68 to expose the metal caps 66. The openings may be patterned using suitable photolithography and etching techniques, such as those described in FIGS. 2-3 for forming the openings 42. An optional trim process may be performed to widen the openings, which may be similar to the trim process described previously for FIG. 4. A sacrificial layer (not shown) may be deposited in the openings, and horizontal portions of the sacrificial layer may be removed to re-expose the metal cap 66. The sacrificial layer may be similar to the sacrificial layer 44 described for FIG. 5, and the horizontal portions of the sacrificial layer may be removed in a manner similar to that described for FIG. 6. The conductive features 154 may be formed in the openings, and may be formed using similar materials or techniques as the conductive features 54 described in FIGS. 7-9. For example, the conductive features 154 may include a barrier layer and a conductive material formed over the barrier layer. A planarization process may be performed to remove excess material. The conductive features 154 may physically and electrically contact the metal caps 66.

The sacrificial layer may be removed using techniques similar to those described for FIG. 10, forming air spacers 160 around the conductive features 154 An inhibitor material (not shown) may then be formed on the conductive features 154. The inhibitor material may be similar to the inhibitor material 62 described for FIG. 11, and may be formed using similar techniques. A first etch stop material 164 may then be deposited over the dielectric material 134, which may be similar to the first etch stop material 64 described earlier. The inhibitor material may then be removed using techniques similar to those described for FIG. 13. Metal caps 166 may then be formed on the conductive features 154 and may seal the air spacers 160. The metal caps 166 may be similar to the metal caps 66 and may be formed in a similar manner. A second etch stop material 168 may then be formed over the first etch stop material 164 and the metal caps 166, in some embodiments. The second etch stop material 168 may be similar to the second etch stop material 68 described for FIG. 15. Processes similar to these may be repeated to form multiple layers of conductive features with air spacers, in some embodiments. Other types of conductive features (e.g., without air spacers) may be formed on or over the conductive features 54, in other embodiments. In this manner, a package component 120 may be formed having multiple layers of interconnected conductive features with air spacers. As described previously, the use of air spacers can reduce parasitic capacitance and improve device performance.

Figure 17:
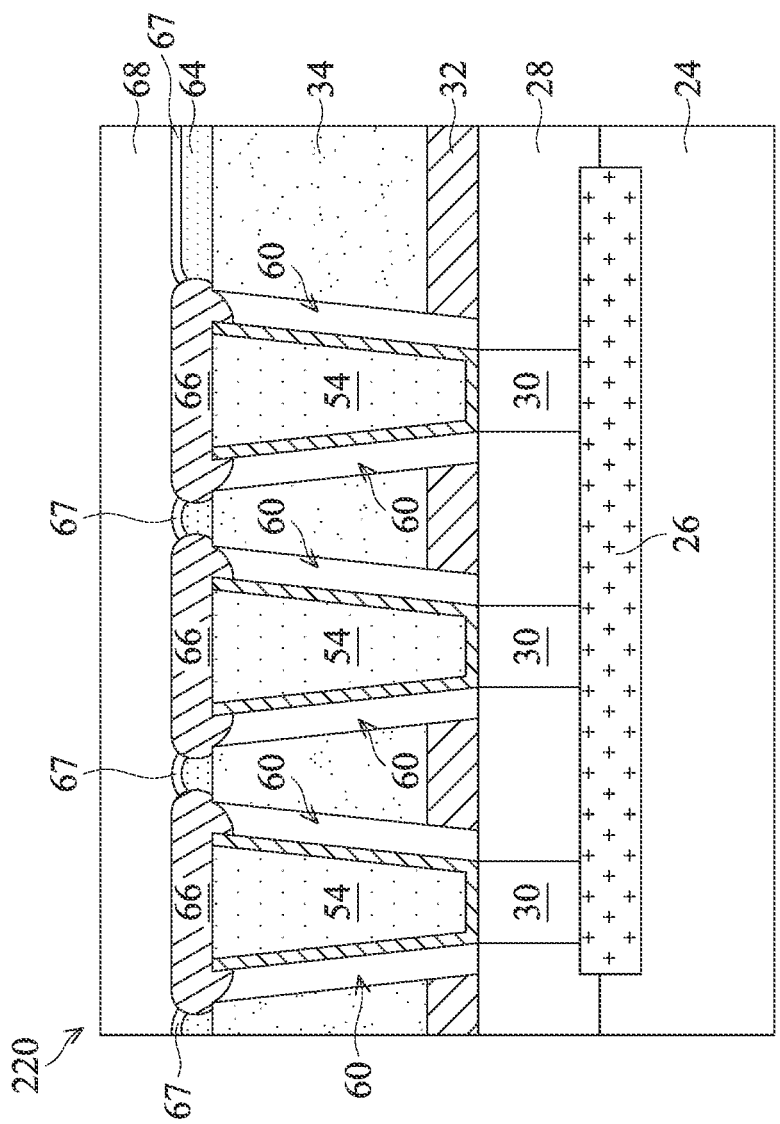
FIG. 17 illustrates a cross-sectional view of a package component including conductive features with air spacers, in accordance with some embodiments.

FIG. 17 illustrates a package component 220, in accordance with some embodiments. The package component 220 is similar to the package component 20 shown in FIG. 15, except an oxidized layer 67 is present between the first etch stop material 64 and the second etch stop material 68. In some cases, surface regions of the first etch stop material 64 may become oxidized prior to forming the second etch stop material 68. This may form an oxidized layer 67 covering the first etch stop material 64. The second etch stop material 68 may then be formed on the oxidized layer 67 instead of directly on the first etch stop material 64. As an example, in some embodiments, the first etch stop material 64 may be aluminum nitride. After formation, surfaces of the aluminum nitride may become oxidized to form an oxidized layer 67 of aluminum oxide. In some cases, the oxidized layer 67 of aluminum oxide also includes a concentration of nitrogen (e.g., the oxidized layer 67 comprises aluminum oxynitride). The second etch stop material 68 subsequently formed on the oxidized layer may comprise a suitable material, such as aluminum nitride. These materials are examples, and other materials are possible.

FIG. 18 illustrates a package component 320 comprising a transistor 90, in accordance with some embodiments. The package component 320 may be similar to the package component 20 described previously, except that the integrated circuit devices 26 of package component 20 are shown explicitly as a transistor 90. The transistor 90 may be, for example, a planar transistor, a Fin Field-Effect Transistor (FinFET), a Nanostructure FET (NFET/NSFET), or the like. In accordance with some embodiments, the transistor 90 is formed at the top surface of the substrate 24. The transistor 90 includes source/drain regions 94 and a gate stack 92. Gate spacers 93 are on sidewalls of the gate stack 92. Source/drain silicide regions 96 are formed over and contacting the source/drain regions 94, and source/drain contact plugs 98 are formed over and connected to the source/drain regions 94 through the source/drain silicide regions 96. The transistor 90 described for FIG. 18 is a non-limiting example used for illustrative purposes, and one of ordinary skill in the art should appreciate that other transistor types, designs, or configurations are possible.

The package component 320 includes conductive features 54 that may be similar to the conductive features 54 described previously for FIGS. 1-15. The conductive features 54 may be formed using techniques similar to those described for FIGS. 1-15. For example, the conductive features 54 are surrounded by air spacers 60, and the air spacers 60 are sealed by metal caps 66. The conductive features 54 are formed over and make electrical connections to the source/drain contact plugs 98 and the gate stack 92.

The embodiments of the present disclosure have some advantageous features. By forming air spacers, the parasitic capacitance between neighboring conductive features may be reduced. By sealing the air spacers with metal caps formed on the conductive features, the volume of the air spacers may be increased, which can further reduce the parasitic capacitance. Additionally, the techniques described herein form an isolation between adjacent metal caps, which can reduce the chance of leakage or shorting. This can allow for forming conductive features having a smaller pitch and/or forming air spacers having a larger volume. In this manner, device performance can be improved and yield can be improved.

In accordance with some embodiments of the present disclosure, a method includes etching a dielectric layer to form an opening, wherein the opening exposes a surface of a first conductive feature underlying the dielectric layer; depositing a sacrificial layer on sidewalls of the opening; forming a second conductive feature in the opening, wherein the second conductive feature physically and electrically contacts the first conductive feature; removing the sacrificial layer to form an air spacer surrounding the second conductive feature; forming an inhibitor material on the second conductive feature, wherein the inhibitor material laterally extends at least partially over the air spacer; forming a first etch stop material on the dielectric layer, wherein the inhibitor material blocks formation of the first etch stop material on the inhibitor material; removing the inhibitor material; and forming a metal cap on the second conductive feature, wherein the metal cap laterally extends over the air spacer, wherein forming the metal cap seals the air spacer with the metal cap. In an embodiment, the depositing the sacrificial spacer layer includes a conformal deposition process. In an embodiment, the method includes forming a second etch stop material on the metal cap and on the first etch stop material. In an embodiment, the second etch stop material includes aluminum nitride. In an embodiment, the inhibitor material extends fully across the air spacer. In an embodiment, sidewalls of the first etch stop material are laterally recessed from the air spacer. In an embodiment, removing the inhibitor material includes performing a thermal process. In an embodiment, forming the second conductive feature includes depositing a conductive barrier layer on the sacrificial layer and the first conductive feature and depositing a conductive fill material on the conductive barrier layer.

In accordance with some embodiments of the present disclosure, a method includes forming an integrated circuit device in a semiconductor substrate; depositing a dielectric layer over the integrated circuit device; patterning an opening in the dielectric layer, wherein the opening exposes a first conductive feature of the integrated circuit device; depositing a layer of sacrificial material in the opening; depositing a barrier layer on the sacrificial material and on the first conductive feature; depositing a conductive material on the barrier layer, wherein the conductive material fills the opening; removing the sacrificial material to form a gap extending between a sidewall of the barrier layer and a sidewall of the dielectric layer; depositing an inhibitor material using a first selective deposition process, wherein the first selective deposition process deposits the inhibitor material on the conductive material over the dielectric layer, wherein the inhibitor material protrudes laterally over the gap; depositing a first etch stop material using a second selective deposition process, wherein the second selective deposition process deposits the first etch stop material on the dielectric layer over the inhibitor material; removing the inhibitor material; and depositing a metal material using a third selective deposition process, wherein the third selective deposition process deposits the metal material on the conductive material over the dielectric layer, wherein the metal material extends across the gap from a top surface of the conductive material to a top surface of the dielectric layer. In an embodiment, the method includes depositing a second etch stop material extending over the first etch stop material and the metal material. In an embodiment, the first etch stop material and the second etch stop material include the same material. In an embodiment, the method includes after depositing the layer of sacrificial material, performing an etching process to remove a bottom portion of the sacrificial material within the opening to expose the first conductive feature. In an embodiment, the first selective deposition process includes submerging the semiconductor substrate in a wet chemical mixture. In an embodiment, the first etch stop material includes aluminum oxide or aluminum nitride, and wherein the second selective deposition process includes atomic layer deposition (ALD). In an embodiment, the inhibitor material has convex sidewalls.

In accordance with some embodiments of the present disclosure, a device includes a first conductive feature in an insulating layer; a dielectric layer over the first conductive feature; a second conductive feature in the dielectric layer, wherein the second conductive feature is over and physically contacting the first conductive feature; an air spacer encircling the second conductive feature, wherein sidewalls of the second conductive feature are exposed to the air spacer; a metal cap covering the second conductive feature and extending over the air spacer, wherein the air spacer is sealed by a bottom surface of the metal cap; a first etch stop layer on the dielectric layer, wherein a sidewall of the first etch stop layer physically contacts a sidewall of the metal cap; and a second etch stop layer extending on a top surface of the metal cap and a top surface of the first etch stop layer. In an embodiment, the first etch stop layer includes a layer of aluminum nitride and a layer of aluminum oxide. In an embodiment, the sidewall of the metal cap has a convex profile and the sidewall of the first etch stop layer has a concave profile. In an embodiment, the metal cap physically contacts a top surface of the dielectric layer. In an embodiment, the metal cap includes cobalt.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    etching a dielectric layer to form an opening, wherein the opening exposes a surface of a first conductive feature underlying the dielectric layer;
    depositing a sacrificial layer on sidewalls of the opening;
    forming a second conductive feature in the opening, wherein the second conductive feature physically and electrically contacts the first conductive feature;
    removing the sacrificial layer to form an air spacer surrounding the second conductive feature;
    forming an inhibitor material on the second conductive feature, wherein the inhibitor material laterally extends at least partially over the air spacer;
    forming a first etch stop material on the dielectric layer, wherein the inhibitor material blocks formation of the first etch stop material on the inhibitor material;
    removing the inhibitor material; and
    forming a metal cap on the second conductive feature, wherein the metal cap laterally extends over the air spacer, wherein forming the metal cap seals the air spacer with the metal cap.

2. The method of claim 1, wherein the depositing the sacrificial layer comprises a conformal deposition process.

3. The method of claim 1 further comprising forming a second etch stop material on the metal cap and on the first etch stop material.

4. The method of claim 3, wherein the second etch stop material comprises aluminum nitride.

5. The method of claim 1, wherein the inhibitor material extends fully across the air spacer.

6. The method of claim 1, wherein sidewalls of the first etch stop material are laterally recessed from the air spacer.

7. The method of claim 1, wherein removing the inhibitor material comprises performing a thermal process.

8. The method of claim 1, wherein forming the second conductive feature comprises:
    depositing a conductive barrier layer on the sacrificial layer and the first conductive feature; and
    depositing a conductive fill material on the conductive barrier layer.

9. A method comprising:
    forming an integrated circuit device in a semiconductor substrate;
    depositing a dielectric layer over the integrated circuit device;
    patterning an opening in the dielectric layer, wherein the opening exposes a first conductive feature of the integrated circuit device;
    depositing a layer of sacrificial material in the opening;
    depositing a barrier layer on the sacrificial material and on the first conductive feature;
    depositing a conductive material on the barrier layer, wherein the conductive material fills the opening;
    removing the sacrificial material to form a gap extending between a sidewall of the barrier layer and a sidewall of the dielectric layer;
    depositing an inhibitor material using a first selective deposition process, wherein the first selective deposition process deposits the inhibitor material on the conductive material over the dielectric layer, wherein the inhibitor material protrudes laterally over the gap;
    depositing a first etch stop material using a second selective deposition process, wherein the second selective deposition process deposits the first etch stop material on the dielectric layer over the inhibitor material;
    removing the inhibitor material; and
    depositing a metal material using a third selective deposition process, wherein the third selective deposition process deposits the metal material on the conductive material over the dielectric layer, wherein the metal material extends across the gap from a top surface of the conductive material to a top surface of the dielectric layer.

10. The method of claim 9 further comprising depositing a second etch stop material extending over the first etch stop material and the metal material.

11. The method of claim 10, wherein the first etch stop material and the second etch stop material comprise the same material.

12. The method of claim 9 further comprising, after depositing the layer of sacrificial material, performing an etching process to remove a bottom portion of the sacrificial material within the opening to expose the first conductive feature.

13. The method of claim 9, wherein the first selective deposition process comprises submerging the semiconductor substrate in a wet chemical mixture.

14. The method of claim 9, wherein the first etch stop material comprises aluminum oxide or aluminum nitride, and wherein the second selective deposition process comprises atomic layer deposition (ALD).

15. The method of claim 9, wherein the inhibitor material has convex sidewalls.

16. A method comprising:
   forming a first conductive feature in an insulating layer;
   forming a dielectric layer over the first conductive feature;
   forming a second conductive feature in the dielectric layer, wherein the second conductive feature is over and physically contacting the first conductive feature;
   forming an air spacer encircling the second conductive feature, wherein sidewalls of the second conductive feature are exposed to the air spacer;
   forming a conductive metal cap covering the second conductive feature and extending over the air spacer, wherein the air spacer is sealed by a bottom surface of the metal cap; and
   forming a first etch stop layer on the dielectric layer, wherein a sidewall of the first etch stop layer physically contacts a sidewall of the metal cap.

17. The method of claim 16 further comprising forming a second etch stop layer extending on a top surface of the metal cap and a top surface of the first etch stop layer.

18. The method of claim 16, wherein the metal cap physically contacts a top surface of the dielectric layer.

19. The method of claim 16, wherein the metal cap comprises cobalt.

20. The method of claim 16, further comprising depositing an inhibitor material, wherein the inhibitor material covers the second conductive feature and extends over the air spacer.

* * * * *